(12) United States Patent
Fang et al.

(10) Patent No.: US 9,679,830 B2
(45) Date of Patent: Jun. 13, 2017

(54) SEMICONDUCTOR PACKAGE

(71) Applicant: MEDIATEK INC., Hsin-Chu (TW)

(72) Inventors: Jia-Wei Fang, Hsinchu (TW);
Tzu-Hung Lin, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/830,727

(22) Filed: Aug. 19, 2015

(65) Prior Publication Data

US 2016/0126161 A1 May 5, 2016

Related U.S. Application Data

(60) Provisional application No. 62/073,022, filed on Oct. 31, 2014.

(51) Int. Cl.
| | |
|---|---|
| *H01L 23/00* | (2006.01) |
| *H01L 23/48* | (2006.01) |
| *H01L 23/31* | (2006.01) |
| *H01L 23/532* | (2006.01) |
| *H01L 23/498* | (2006.01) |
| H01L 25/065 | (2006.01) |

(52) U.S. Cl.
CPC ........ *H01L 23/481* (2013.01); *H01L 23/3142* (2013.01); *H01L 23/49838* (2013.01); *H01L 23/53228* (2013.01); *H01L 24/06* (2013.01); *H01L 24/09* (2013.01); *H01L 25/0655* (2013.01); *H01L 2224/0401* (2013.01); *H01L 2224/0603* (2013.01); *H01L 2224/08235* (2013.01); *H01L 2224/13147* (2013.01); *H01L 2224/16227* (2013.01); *H01L 2224/32225* (2013.01); *H01L 2224/73204* (2013.01); *H01L 2224/92125* (2013.01); *H01L 2924/157* (2013.01); *H01L 2924/1579* (2013.01); *H01L 2924/15192* (2013.01); *H01L 2924/15311* (2013.01); *H01L 2924/15787* (2013.01)

(58) Field of Classification Search
CPC .................................................. H01L 23/481
See application file for complete search history.

(56) References Cited

U.S. PATENT DOCUMENTS

2012/0267779 A1* 10/2012 Lin .................... H01L 23/49838
257/737
2013/0020675 A1* 1/2013 Kireev .................... H01L 25/16
257/531

* cited by examiner

*Primary Examiner* — William Harriston
(74) *Attorney, Agent, or Firm* — Winston Hsu

(57) ABSTRACT

A semiconductor package includes a packaging substrate having a first surface and a second surface opposite to the first surface; and a semiconductor die assembled on the first surface of the packaging substrate. The semiconductor die includes a plurality of first bump pads and second bump pads on an active surface of the semiconductor die, a plurality of first copper pillars on the first bump pads, and a plurality of second copper pillars on the second bump pads. The first copper pillars have a diameter that is smaller than that of the second copper pillars.

4 Claims, 3 Drawing Sheets

SEMICONDUCTOR PACKAGE

CROSS REFERENCE TO RELATED APPLICATIONS

This application claims the benefit of U.S. provisional application No. 62/073,022 filed Oct. 31, 2014.

BACKGROUND

The present invention relates to the field of semiconductor package with mixed copper pillar or bump pad sizes.

In order to ensure miniaturization and multi-functionality of electronic products or communication devices, semiconductor packages are required to be of small in size, multi-pin connection, high speed, and high functionality. Increased Input-Output (I/O) pin count combined with increased demands for high performance ICs has led to the development of flip chip packages.

Flip-chip technology typically uses solder bumps on chip to interconnect the package media such as package substrate. The flip-chip is bonded face down to the package substrate through the shortest path. These technologies can be applied not only to single-chip packaging, but also to higher or integrated levels of packaging in which the packages are larger and to more sophisticated substrates that accommodate several chips to form larger functional units. The flip-chip technique, using an area array, has the advantage of achieving the higher density of interconnection to the device and a very low inductance interconnection to the package.

Recently, copper pillar bump technology has been proposed. Instead of using a solder bump, the electronic component is connected to a substrate by means of a copper pillar bump, which achieves finer pitch with minimum probability of bump bridging, reduces the capacitance load for the circuits, and allows the electronic component to perform at higher frequencies.

Conventional flip-chip package utilizing copper pillar bump is implemented with a single copper pillar size. For example, to meet huge amount of die-to-die connections, a smaller copper pillar size is used. However, this makes the high-speed or power-consuming IP fail to meet the electrical constraints. On the other hand, when a larger size of the copper pillar is used, the die size greatly increases.

SUMMARY

It is one object of this invention to provide an improved semiconductor packaging with mixed copper pillar sizes (or mixed bump pad sizes) to solve the above-mentioned prior art problems and shortcomings.

According to one embodiment of the invention, a semiconductor package includes a packaging substrate having a first surface and a second surface opposite to the first surface; and a semiconductor die assembled on the first surface of the packaging substrate. The semiconductor die includes a plurality of first bump pads and second bump pads on an active surface of the semiconductor die, a plurality of first vias on the first bump pads, and a plurality of second vias on the second bump pads. Each of the first vias has a diameter that is smaller than that of each of the second vias.

According to one embodiment of the invention, the first vias and the second vias are copper pillars.

According to one embodiment of the invention, the semiconductor package further comprises an underfill layer disposed between the semiconductor die and the packaging substrate to surround the first vias and the second vias.

According to another embodiment of the invention, a semiconductor package includes a packaging substrate having a first surface and a second surface opposite to the first surface; and a semiconductor die assembled on the first surface of the packaging substrate. The semiconductor die includes a plurality of first bump pads and second bump pads on an active surface of the semiconductor die, and a plurality of vias on the second bump pads. The first bump pads have a pad size that is smaller than that of the second bump pads.

According to another embodiment of the invention, a semiconductor package, includes a packaging substrate having a first surface and a second surface opposite to the first surface; a first semiconductor die assembled on the first surface of the packaging substrate, wherein the first semiconductor die comprises a plurality of first bump pads and second bump pads on an active surface of the first semiconductor die, a plurality of first vias on the first bump pads, and a plurality of second vias on the second bump pads, wherein the first vias have a diameter that is smaller than that of the second vias; and a second semiconductor die assembled on the first surface of the packaging substrate.

The second semiconductor die includes a plurality of third bump pads and fourth bump pads on an active surface of the second semiconductor die, a plurality of third vias on the third bump pads, and a plurality of fourth vias on the fourth bump pads, wherein the third vias have a diameter that is smaller than that of the fourth vias.

The first bump pads, the first vias, the third bump pads and the third vias form die-to-die connections between the first semiconductor die and the second semiconductor die through at least a metal wire in or on the packaging substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
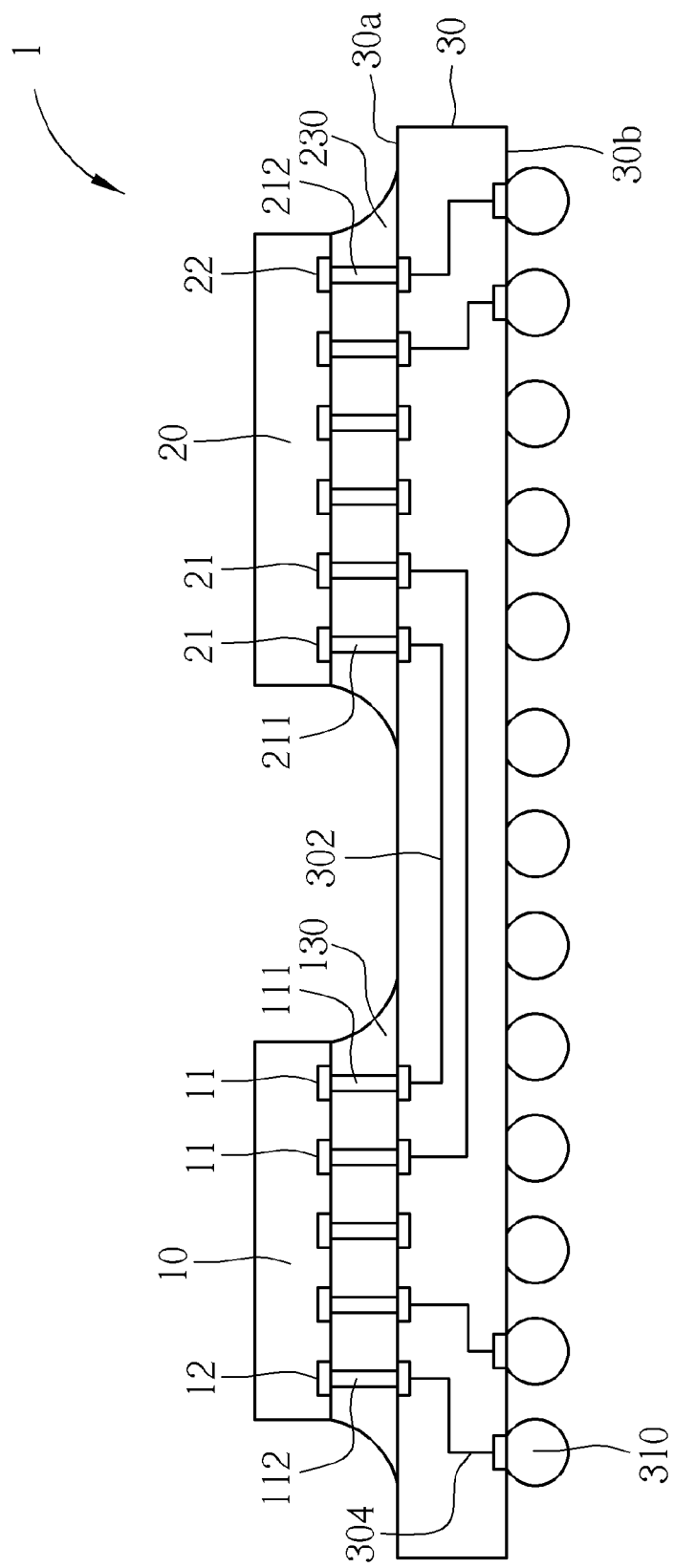
FIG. 1 is a schematic, cross-sectional diagram showing a multi-die flip-chip package according to one embodiment of the invention.

It is to be understood that the following disclosure provides many different embodiments, or examples, for implementing different features of various embodiments. Specific examples of components and arrangements are described below to simplify the present disclosure. These are merely examples and are not intended to be limiting.

In addition, the present disclosure may repeat reference numerals and/or letters in the various examples. This repetition is for the purpose of simplicity and clarity and does not in itself indicate a relationship between the various embodiments and/or configurations discussed.

Moreover, the formation of a first feature over or on a second feature in the description that follows may include embodiments in which the first and second features are formed in direct contact or not in direct contact.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The terms "die", "semiconductor chip", and "semiconductor die" are used interchangeable throughout the specification. A die in the context of integrated circuits is a small block of semiconducting material, on which a given functional circuit is fabricated.

FIG. 1 is a schematic, cross-sectional diagram showing a multi-die flip-chip package according to one embodiment of the invention. As shown in FIG. 1, the multi-die flip-chip package 1 comprises a first die 10 and a second die 20 with both their active surfaces facing the first surface 30a of the packaging substrate 30. The aforesaid first surface 30a of the packaging substrate 30 is also defined as a "chip side". According to the embodiment of the invention, the first die 10 may be assembled to the first surface 30a of the packaging substrate 30 through a plurality of vias 111 and 112 such as copper vias or copper pillars, and the second die 20 may be assembled to the first surface 30a of the packaging substrate 30 through a plurality of vias 211 and 212 such as copper vias or copper pillars.

The packaging substrate 30 may be a plastic substrate, a ceramic substrate, or a silicon substrate such as an interposer. According to the embodiment of the invention, for example, the packaging substrate 30 may have a laminated plastic structure fabricated starting with a double sided copper clad lamination (CCL), but not limited thereto. It is understood that the packaging substrate 30 may have multiple metal wiring layers, for example, two layers, four layers, or six layers according to the embodiments of the invention.

An underfill layer 130 may be disposed between the first die 10 and the packaging substrate 30 to surround the vias 111 and 112. An underfill layer 230 may be disposed between the second die 10 and the packaging substrate 30 to surround the vias 211 and 212. It is known that the underfill layers 130 and 230 control the stress caused by the difference in thermal expansion between the die and the packaging substrate. Once cured, the underfill layers absorb the stress, reducing the strain on the bumps or pillars, greatly increasing the life of the finished package. It is understood that in some cases, the underfill layer may be omitted or replaced with other suitable materials.

According to the embodiment of the invention, the vias 111 and 211 are disposed on the bump pads 11 and 21 on the active surfaces of the first die 10 and second die 20, respectively. The vias 111 and 211 have a relatively smaller diameter size, for example, a diameter smaller than 50 micrometers, but not limited thereto. The bump pads 11 and 21 and the vias 111 and 211 are used to form die-to-die connections and are mostly used to convey digital signals between the first die 10 and the second die 20 through the metal wire 302 in or on the packaging substrate 30.

According to the embodiment of the invention, the vias 112 and 212 are disposed on the bump pads 12 and 22 on the active surfaces of the first die 10 and second die 20, respectively. The vias 112 and 212 have a relatively larger diameter size, for example, a diameter ranging greater than 80 micrometers, but not limited thereto. The bump pads 12 and 22 and the copper pillars 112 and 212 are used to form die-to-substrate connections and are mostly used to convey analog, power, or ground signals between the die 10/20 and the packaging substrate 30 through at least a metal wire or trace 304 in the packaging substrate 30.

According to the embodiment of the invention, a diameter ratio between the via 112 and the via 111 is greater than 1. According to another embodiment of the invention, a diameter ratio between the via 112 and the via 111 is greater than 2.

According to the embodiment of the invention, a diameter ratio between the via 212 and the via 211 is greater than 1. According to another embodiment of the invention, a diameter ratio between the via 212 and the via 211 is greater than 2.

According to the embodiment of the invention, a diameter ratio between the bump pad 12 and the bump pad 11 is greater than 1. According to another embodiment of the invention, a diameter ratio between the bump pad 12 and the bump pad 11 is greater than 2.

According to the embodiment of the invention, a diameter ratio between the bump pad 22 and the bump pad 21 is greater than 1. According to another embodiment of the invention, a diameter ratio between the bump pad 22 and the bump pad 21 is greater than 2.

According to the embodiment of the invention, a plurality of solder balls 310 may be disposed on the second surface 30b of the packaging substrate 30 for the electrical connection between the dies and a printed circuit board (PCB; not shown). The second surface 30a of the packaging substrate 30 is also defined as a "PCB side".

Figure 2:
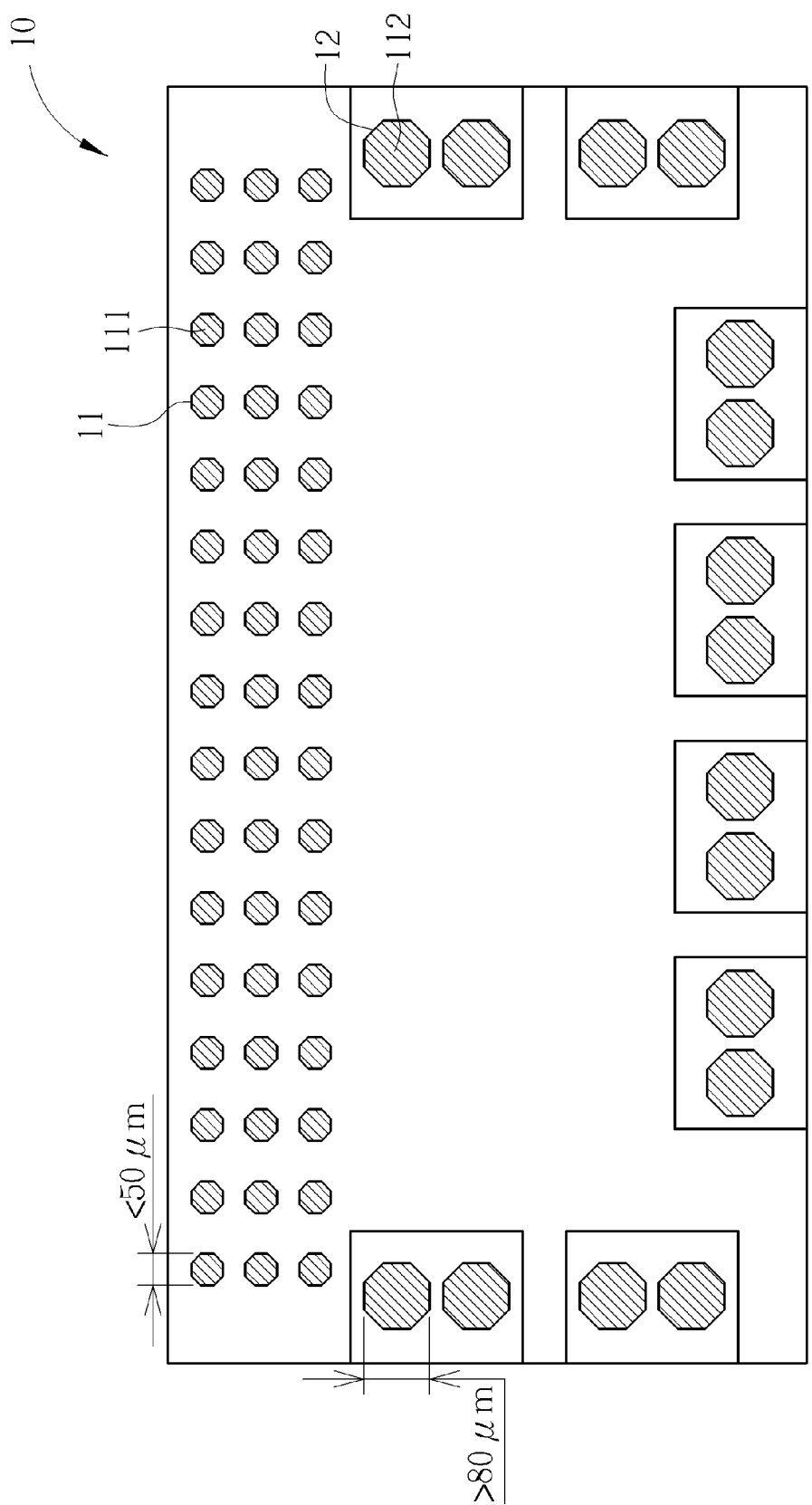
FIG. 2 is a schematic layout diagram showing an exemplary mixed copper pillar sizes on the active surface of a semiconductor die according to one embodiment of the invention.

Please refer to FIG. 2. FIG. 2 is a schematic layout diagram on the active surface of the first die 10 according to one embodiment of the invention, wherein like layers, regions, or elements are designated with like numeral numbers. As shown in FIG. 2, a plurality of bump pads 11 and 12 are provided on the active surface of the first die 10. The bump pads 11 for die-to-die connections have a relatively smaller size, for example, a diameter smaller than 50 micrometers, but not limited thereto. The bump pads 12 for die-to-substrate connection have a relatively larger size, for example, a diameter greater than 80 micrometers, but not limited thereto. It is understood that a third bump pad size on the active surface of the die 10 may be employed in some cases. Vias 112 and 212 such as copper pillars are disposed on the bump pads 12 and 22, respectively.

Figure 3:
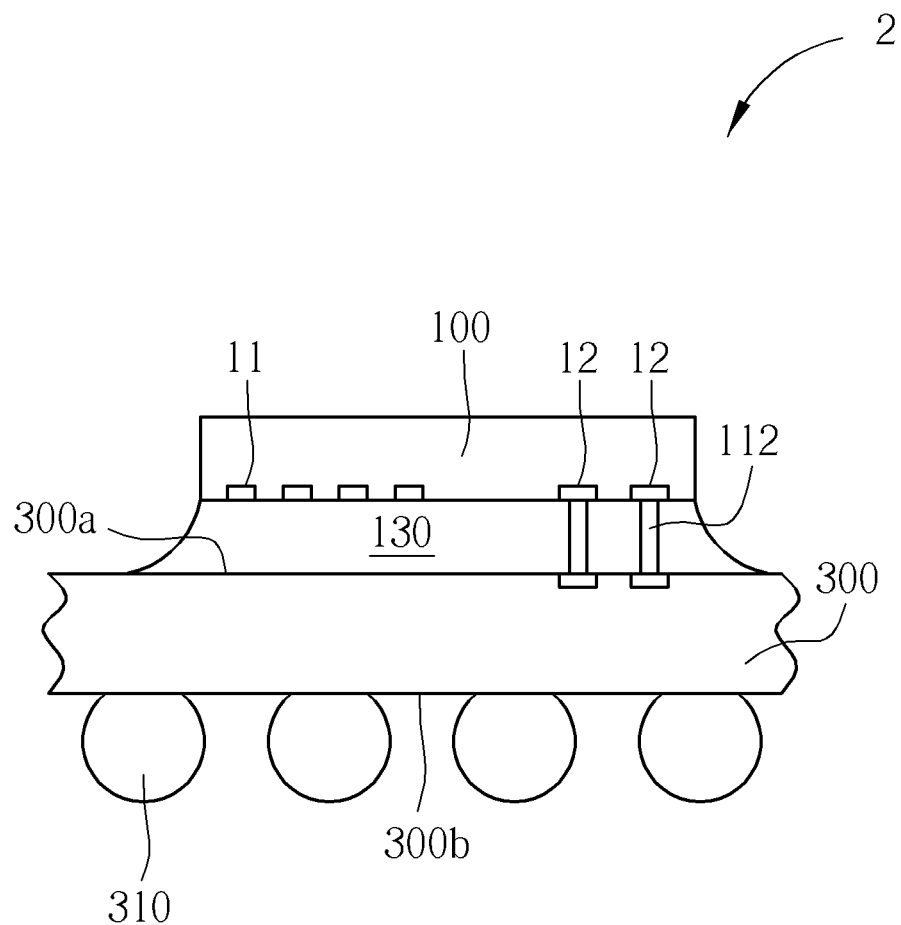
FIG. 3 is a schematic, cross-sectional diagram showing a germane portion of a flip-chip package according to another embodiment of the invention.

FIG. 3 is a schematic, cross-sectional diagram showing a germane portion of a flip-chip package 2 according to another embodiment of the invention, wherein like layers, regions, or elements are designated with like numeral numbers. The flip-chip package 2 may be a single-die package, but not limited thereto. As shown in FIG. 3, the flip-chip package 2 comprises a semiconductor die 100 assembled on a chip side of the packaging substrate 300. According to the embodiment of the invention, the semiconductor die 100 may be assembled to the first surface 300a of the packaging substrate 300 through a plurality of vias 112 such as copper pillars.

A plurality of bump pads 11 and 12 are provided on the active surface of the die 10. The bump pads 11 have a relatively smaller size, for example, a diameter smaller than 50 micrometers. The bump pads 12 for die-to-substrate connection have a relatively larger size, for example, a diameter greater than 80 micrometers. The vias 112 may be disposed on the bump pads 12, respectively. According to the embodiment of the invention, the bump pads 11 are disabled pads and no copper via or copper pillar is formed thereon.

According to the embodiment of the invention, the packaging substrate 300 may be a plastic substrate, a ceramic substrate, or a silicon substrate such as an interposer. According to the embodiment of the invention, for example, the packaging substrate 300 may have a laminated plastic structure fabricated starting with a double sided copper clad lamination (CCL), but not limited thereto. It is understood that the packaging substrate 300 may have multiple metal wiring layers, for example, two layers, four layers, or six layers according to the embodiments of the invention. An underfill layer 130 may be disposed between the semiconductor die 100 and the packaging substrate 300 to surround the copper pillars 112. A plurality of solder balls 310 may be disposed on the second surface 300b of the packaging substrate 300 for the electrical connection between the flip-chip package 2 and a printed circuit board (PCB; not shown).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor package, comprising:
a packaging substrate having a first surface and a second surface opposite to the first surface;
a semiconductor die assembled on the first surface of the packaging substrate, wherein the semiconductor die comprises a plurality of first bump pads and second bump pads on an active surface of the semiconductor die, and a plurality of vias on the second bump pads, wherein the first bump pads have a pad size that is smaller than that of the second bump pads, wherein the first bump pads are disabled pads; and
an underfill layer disposed between the semiconductor die and the packaging substrate to surround the vias, wherein the underfill layer is in direct contact with a surface of each of the disabled pads, and wherein the surface directly faces toward the package substrate.

2. The semiconductor package according to claim 1, wherein the vias are copper pillars.

3. The semiconductor package according to claim 1, wherein diameter ratios between the second bump pads and the first bump pads are greater than 1.

4. The semiconductor package according to claim 1, wherein diameter ratios between the second bump pads and the first bump pads are greater than 2.

* * * * *